United States Patent
Fragapane (10) Patent No.: US 9,515,136 B2
(45) Date of Patent: Dec. 6, 2016

(54) EDGE TERMINATION STRUCTURE FOR A POWER INTEGRATED DEVICE AND CORRESPONDING MANUFACTURING PROCESS

(71) Applicant: STMICROELECTRONICS S.R.L., Agrate Brianza (IT)

(72) Inventor: Leonardo Fragapane, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/666,013

(22) Filed: Mar. 23, 2015

(65) Prior Publication Data
US 2015/0372075 A1 Dec. 24, 2015

(30) Foreign Application Priority Data
Jun. 18, 2014 (IT) .............................. TO2014A0485

(51) Int. Cl.
*H01L 29/15* (2006.01)
*H01L 31/0312* (2006.01)
(Continued)

(52) U.S. Cl.
CPC ........... *H01L 29/063* (2013.01); *H01L 21/266* (2013.01); *H01L 21/761* (2013.01);
(Continued)

(58) Field of Classification Search
USPC .................................. 257/E27.015, E27.017, 257/E27.03–E27.032, 163–166, 197, 205, 257/273, 351, 526, 539, 544, 565–593, 923, 257/E51.004, E31.069, E27.019–E27.023, 257/E27.037–E27.043, E27.053–E27.058, 257/E27.074–E27.078, E27.106, E27.149, 257/E29.03–E29.035, E29.044–E29.045, 257/E29.114, E29.124, E21.372, 257/E21.38–E21.381, E21.608, 9, 93, 334, 257/427, 444, 446, 491, 663, 713, 262, 257/368–401, 77; 438/170, 189, 202, 438/309–378, 217, 287–291, 297, 223, 203, 438/305, 199, 227, 228, 261, 216
See application file for complete search history.

(56) References Cited

U.S. PATENT DOCUMENTS

2002/0063281 A1* 5/2002 Tihanyi ............... H01L 29/0634
257/328
2004/0108549 A1* 6/2004 Denison .............. H01L 29/1095
257/335
(Continued)

FOREIGN PATENT DOCUMENTS

| EP | 0389863 A1 | 10/1990 |
|----|------------|---------|
| JP | 2003303956 A | 10/2003 |
| WO | 9802924 A2 | 1/1998 |

OTHER PUBLICATIONS

R. Stengl et al., "Variation of Lateral Doping—A New Concept to Avoid High Voltage Breakdown of Planar Junctions," International Electron Devices Meeting, Washington DC, Dec. 1-4, 1985, pp. 154-157.
(Continued)

*Primary Examiner* — Tram H Nguyen
(74) *Attorney, Agent, or Firm* — Seed IP Law Group PLLC (57) ABSTRACT

An integrated device has: a structural layer of semiconductor material doped with a first conductivity type and having a top surface defining a plane; a functional region, doped with a second conductivity type, arranged in an active area of the structural layer at the top surface, in the proximity of an edge area of the integrated device, which externally surrounds the active area; and an edge termination region, doped with the second conductivity type, joined to the functional region and arranged in the edge area. The edge termination region has a doping profile and a junction depth that vary in a first direction parallel to the plane.

16 Claims, 6 Drawing Sheets

(51) Int. Cl.
| | |
|---|---|
| H01L 29/06 | (2006.01) |
| H01L 29/16 | (2006.01) |
| H01L 21/761 | (2006.01) |
| H01L 21/266 | (2006.01) |
| H01L 21/82 | (2006.01) |
| H01L 29/739 | (2006.01) |
| H01L 29/78 | (2006.01) |

(52) U.S. Cl.
CPC ....... *H01L21/8213* (2013.01); *H01L 29/1608* (2013.01); *H01L 29/7393* (2013.01); *H01L 29/7802* (2013.01); *H01L 29/7816* (2013.01)

(56) References Cited

U.S. PATENT DOCUMENTS

| | | | | |
|---|---|---|---|---|
| 2006/0067137 | A1* | 3/2006 | Udrea | H01L 21/84 365/189.09 |
| 2006/0068571 | A1 | 3/2006 | Chow et al. | |
| 2010/0289032 | A1* | 11/2010 | Zhang | H01L 21/0465 257/77 |
| 2011/0057256 | A1* | 3/2011 | Sasaki | H01L 29/0615 257/329 |
| 2011/0147766 | A1* | 6/2011 | Tarui | H01L 21/046 257/77 |
| 2013/0140582 | A1 | 6/2013 | Kawakami et al. | |
| 2014/0021490 | A1 | 1/2014 | Ohtsuka et al. | |

OTHER PUBLICATIONS

P.A. Losee et al., "High-Voltage 4H-SiC PiN Rectifiers with Single-Implant, Multi-Zone JTE Termination," 16th International Symposium on Power Semiconductor Devices and ICS, Japan, May 24-27, 2004, pp. 301-304.

* cited by examiner

FIG. 1

(Prior Art)

FIG. 2

(Prior Art)

EDGE TERMINATION STRUCTURE FOR A POWER INTEGRATED DEVICE AND CORRESPONDING MANUFACTURING PROCESS

BACKGROUND

1. Technical Field

The present disclosure relates to an edge termination structure for a power integrated device, for example a power MOS transistor or a power diode, in particular made, at least in part, in a substrate including silicon carbide. The present disclosure further regards a corresponding manufacturing process.

2. Description of the Related Art

In a known way, silicon carbide (SiC) has advantageous electrical properties, such as a wide bandgap, a high critical electrical field and a high thermal conductivity, which render its use particularly promising for high-power, high-voltage, fast-switching and high-operating-temperature applications.

It is further known that the breakdown voltage of power integrated devices suffers, in the edge termination region, from the so-called effect of thickening of the electric-field lines, which tends to limit the maximum theoretical value of the breakdown voltage. This evidently occurs both in the case of devices made in a silicon substrate and in devices made in a silicon-carbide substrate.

The development of an effective edge termination structure, that allows reaching a breakdown voltage close to the theoretical values, is an important consideration in the design of power integrated devices.

In the past, a wide range of solutions of termination structures has been proposed, with the purpose of mitigating the edge effects.

In general, the techniques proposed envisage suitable modification of the distribution of the electric field at the boundary of the main junction of the power integrated device, for exploiting at best the edge region, reducing the peak value of the surface electric field to a minimum.

Figure 1:
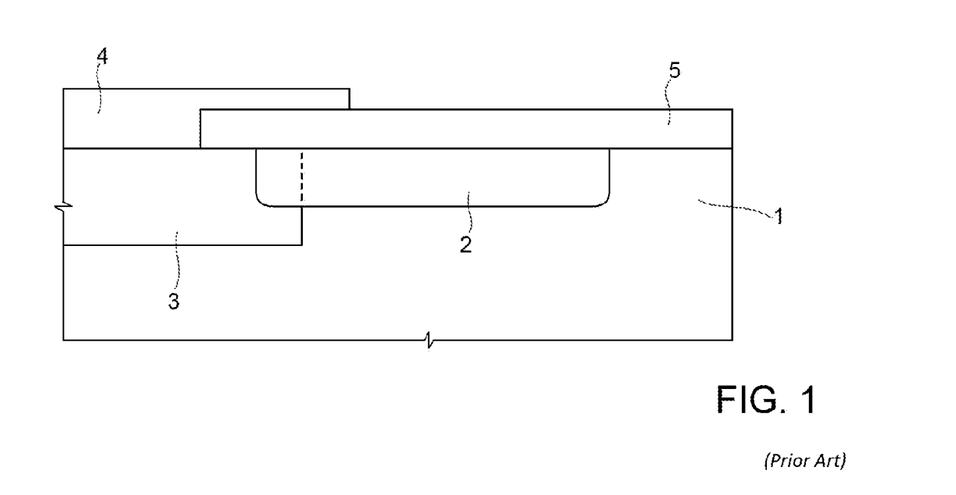
FIG. 1 is a cross-sectional view of an edge termination structure for an integrated device, of a known type.

For instance, as shown in FIG. 1, a known edge termination solution envisages providing, in a substrate (or structural layer) 1 a power integrated device (for example, including silicon carbide) and a ring region 2, which is connected, joined, to a main junction region 3 of the power integrated device, at the edge region.

It should be noted that by the expression "main junction region" is meant a doped region of the device, provided in the active area and bordering on the edge region, which forms with the substrate 1 a semiconductor junction, functional to the operations performed by the power integrated device; further, by "ring region" is meant a doped edge termination region, generally but not necessarily having an overall ring shape (with circular, square, rectangular, or in general polygonal cross-section) that surrounds the main junction region, or in general an active area of the power integrated device.

A metal region 4, referred to as "field-plate region" is present on the substrate 1, and is arranged directly in contact with the main junction region 3 and is separated from the ring region 2 by a field-oxide region 5.

The depth in the substrate 1 of the ring region 2 may be lower (as shown in FIG. 1), or alternatively higher (in a way not illustrated herein), than the depth of the main junction region 3.

This solution has the advantage of being simple to manufacture, given the use of just one mask and just one dopant implantation to obtain and dope the ring region 2. However, this solution does not afford an optimal control of the distribution of the electric field (generally, peaks of electric field may be found in the proximity of the end of the metal region 4 and of the ring region 2).

Figure 2:
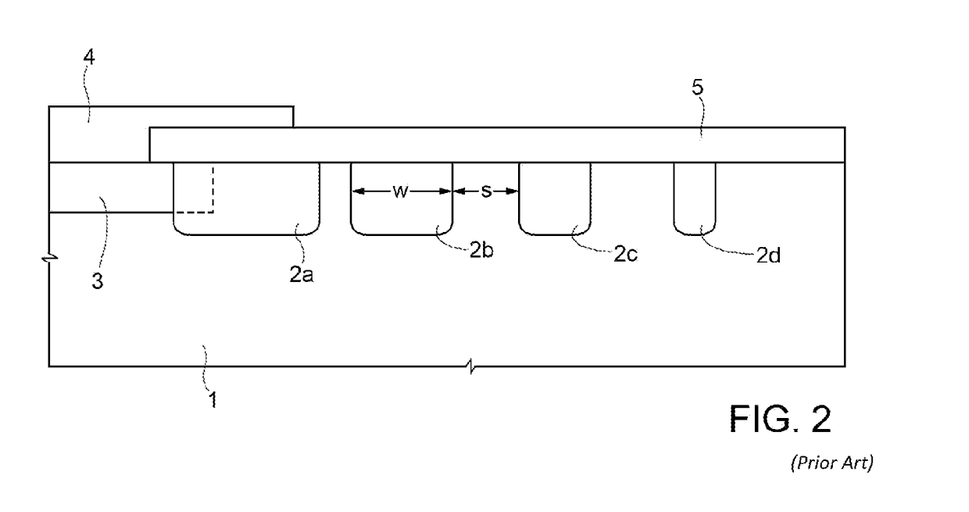
FIG. 2 is a cross-sectional view of a further edge termination structure for an integrated device, which is also of a known type.

A further solution that has been proposed envisages, as shown in FIG. 2, providing in the substrate 1 a plurality of ring regions, designated by 2a, 2b, 2c and 2d in the example.

One of the ring regions, in the example the ring region 2a, is arranged in contact with the main junction region 3 and once again may have depth higher (as shown in FIG. 2), or alternatively lower (in a way not illustrated herein), than the depth of the main junction region 3.

Ring regions 2a-2d have a variable width W, as likewise variable is the distance of separation S between the same ring regions 2a-2d; in the design stage, one or both of the characteristics of width W and distance of separation S may be appropriately sized to obtain a desired profile of the electric field at the edge termination region.

This solution has the advantage of enabling in this way a better control of the electric field, albeit maintaining a good degree of manufacturing simplicity, envisaging once again use of just one mask and just one dopant implantation.

However, peaks of electric field are present in the areas of transition between the ring regions 2a-2d, the presence of which jeopardizes performance.

More complex edge termination structures have further been proposed, which envisage, for example, providing so-called floating guard rings, VLD (variation in lateral doping) rings, variable-transparency rings, mesa-etching structures, structures with lateral junction extension (JTE).

Some of these solutions have been implemented also in the field of power integrated devices made in silicon-carbide substrates, appropriately adapted to take into account the peculiar electrical characteristics of the silicon carbide itself. In general, however, direct transfer of the edge termination techniques from silicon to silicon carbide is somewhat problematical, on account of the different properties of the two materials and of the consequent different manufacturing techniques and of the different electrical behavior.

Among these properties, for example, the lower diffusiveness of the dopants within silicon carbide as compared to silicon is known.

In general, none of the edge termination structures of a known type is thus optimized for use in power integrated devices made in silicon-carbide substrates.

BRIEF SUMMARY

One embodiment of the present disclosure is provides an edge termination structure designed for the electrical characteristics of silicon carbide.

According to the present disclosure, a power integrated device provided with an edge termination structure and a corresponding manufacturing process are provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 3:
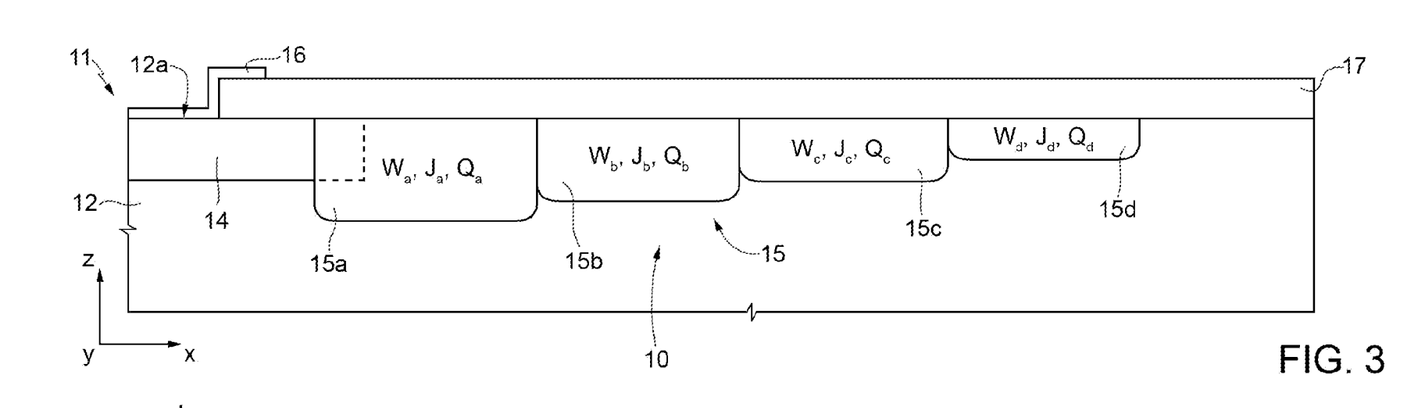
FIG. 3 is a cross-sectional view of an edge termination structure for an integrated device, according to an embodiment of the present solution.

FIG. 3 shows an edge termination structure 10 of an integrated device 11, in particular a power device (of which just an end portion is shown, corresponding to an edge area), according to an aspect of the present solution.

The integrated device 11 may, for example, be a MOS transistor or a power diode.

The integrated device 11 comprises a structural layer (or substrate) 12, in particular including silicon carbide (SiC), having a top surface 12a, arranged in a horizontal plane xy; the structural layer 12 has a first doping type, for example a doping of an N type.

In a way not illustrated and in a per se known manner, the integrated device 11 includes, in the active area, a plurality of doped regions defining semiconductor junctions, electrodes and metallizations.

FIG. 3 shows an edge portion of the active area of the integrated device 11, in which a functional region 14 is present, doped with a second doping type, in the example a doping of a P type, which defines a semiconductor junction with the structural layer 12. The functional region 14 is an operating region of the integrated device 11, having, for example, the function of participating in generation of electric current.

According to an aspect of the present solution, the edge termination structure 10 comprises a plurality of ring portions 15a-15d, each constituted by a respective doped region having the second doping type, in the example a doping of a P type.

Purely by way of example, FIG. 3 shows four ring portions 15a-15d; it is, however, evident that any desired number (greater than or equal to two) of said ring portions may be provided.

Each ring portion 15a-15d has: a respective width (or minor dimension) in the horizontal plane xy, designated by Wa-Wd (in FIG. 3, in a first horizontal direction x of the horizontal plane xy); and a respective junction depth Ja-Jd, in an orthogonal direction z, transverse to the horizontal plane xy and to the top surface 12a.

In particular, the ring portions 15a-15d are contiguous and arranged alongside one another in the first horizontal direction x for forming a continuous and uninterrupted ring region 15. Furthermore, a first ring portion 15a is connected with, joined to, the functional region 14, overlapping it by a certain overlapping extent, in the first horizontal direction x.

The respective widths Wa-Wd of the ring portions 15a-15d may be different, or two or more of them may be the same as one another.

Figure 4:
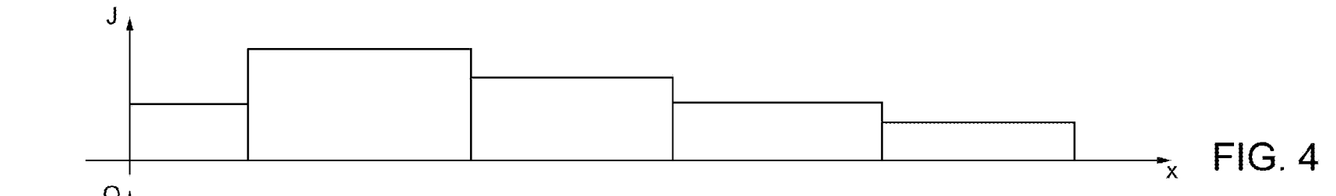
FIGS. 4-5 show plots representing the variable doping profile of the edge termination structure of FIG. 3.

The first ring portion 15a further has a greater junction depth Ja than the other ring portions 15b-15d, which have respective junction depths Jb-Jd that decrease as the respective distance in the first horizontal direction x from the functional region 14 increases, as shown in FIG. 4.

Figure 5:
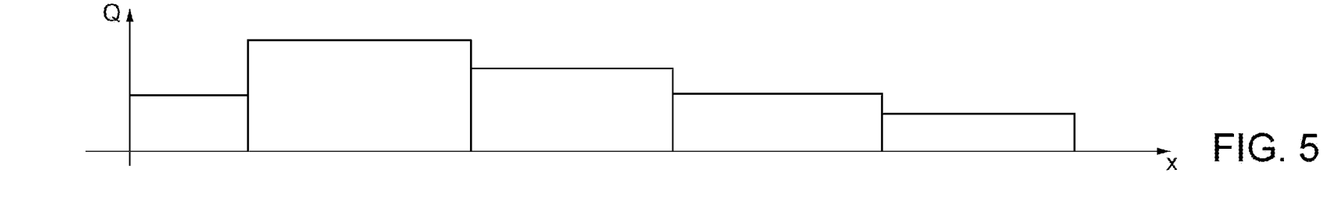

The ring portions 15a-15d further have a respective amount of charge Qa-Qd. In the embodiment illustrated, the first ring portion 15a has a greater amount of charge Qa than the other ring portions 15b-15d, which have respective amounts of charge Qb-Qd that decrease as the respective distance in the first horizontal direction x from the functional region 14 increases, as shown in FIG. 5.

Furthermore, each ring portion 15a-15d has, within it, a variable profile of the dopant concentration C, in the orthogonal direction z, as will be described and illustrated hereinafter.

Basically, the resulting modulation of charge of the ring region 15 defines a variable doping profile both laterally, i.e., parallel to the horizontal plane xy (for example, in the horizontal direction x) and vertically, i.e., in the orthogonal direction z. The ring region 15 itself further has a junction depth, which is also laterally variable, in a direction parallel to the horizontal plane xy.

For instance, the charge profile may be substantially parabolic in the ring region 15 in the horizontal direction x, with a peak at the junction with the functional region 14 and decreasing as the distance in the first horizontal direction x from the functional region 14 increases.

The edge termination structure 10 of the integrated device 11 may further comprise, as illustrated in the aforesaid FIG. 3, a metal field-plate region 16, arranged on the top surface 12a of the structural layer 12, separated from the ring region 15 by a field-oxide region 17.

Figure 6:
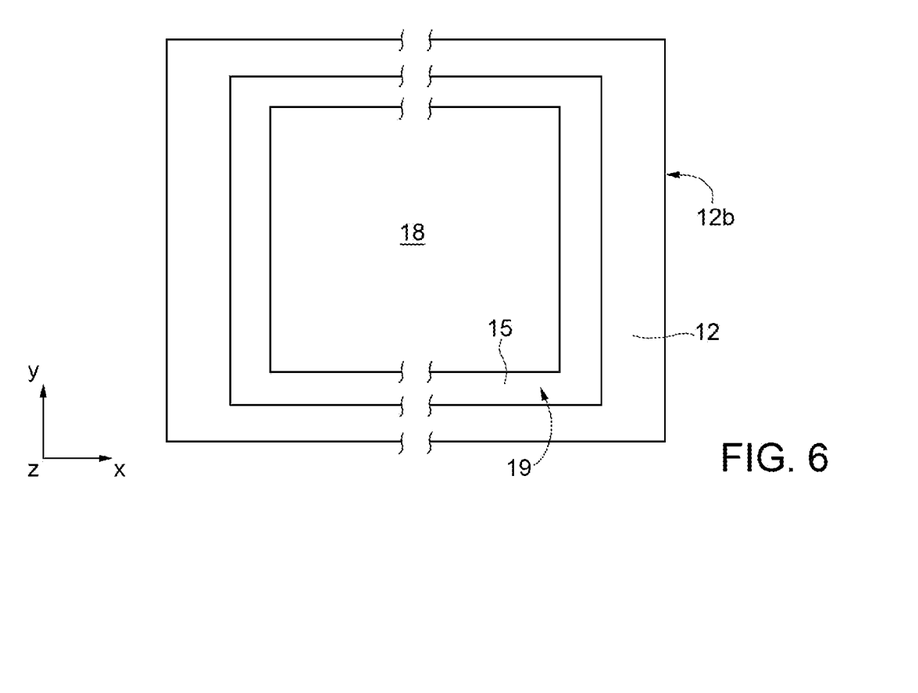
FIG. 6 is a schematic top plan view of a portion of the power integrated device, including the edge termination structure of FIG. 3.

As illustrated schematically in the top plan view of FIG. 6, the ring region 15 may surround entirely in the plane xy the active area of the integrated device 11, here designated by 18.

It should further be noted that an external side wall 12b of the structural layer 12 of the integrated device 11 is arranged at the so-called "scribe lines", i.e., the lines along which a wafer is cut at the end of the manufacturing process to define a corresponding die.

The edge area, here designated by 19, in which the ring region 15 is located, is thus arranged between the active area 18 of the integrated device 11 and the aforesaid external side wall 12b. Furthermore, in an evident way, the aforesaid horizontal direction (the direction x, in the example of FIG. 3), along which the ring region 15 has a laterally variable doping profile, is transverse to the external side wall 12b.

Figure 7A:
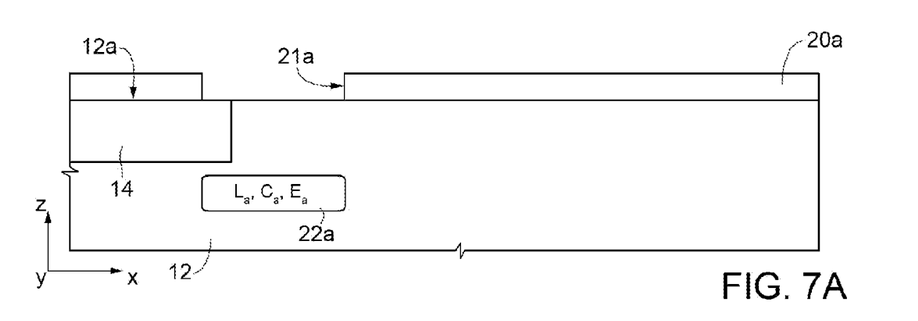
FIGS. 7a-7d are cross-sectional views in successive steps of the manufacturing process of the edge termination structure of FIG. 3, according to an embodiment of the present solution.

The process for manufacturing the edge termination structure 10 comprises, at the end of manufacturing of the active, or functional, parts of the integrated device 11 (here not described in detail, in so far as they are of a per se known type), providing a first mask 20a, over the top surface 12a of the structural layer 12, as shown in FIG. 7a.

The first mask 20a has an opening 21a, having a width such as to expose a portion of the underlying structural layer 12 and in particular an end portion of the functional region 14.

As shown in FIG. 7a, an ion implantation of dopants, in the example of a P type, for instance with aluminum atoms, is made in a self-aligned way through the first mask 20a; the ion implantation is followed by thermal activation, to provide a first doped region 22a, buried at a first depth within the structural layer 12, in particular corresponding to the depth Ja of the first ring portion 15a of the ring region 15.

Furthermore, the width La of the first mask 20a corresponds to the width Wa of the first ring portion 15a of the ring region 15.

The first implantation is carried out with a first energy Ea, such as to locate the first doped region 22a at the desired depth; this first implantation further has a first dopant dose or concentration Ca.

It should be noted that, to obtain the aforesaid first doped region 22a, the peculiarity of silicon carbide is thus exploited, whereby the implanted ions are located at a depth that depends directly on the implantation energy and do not subsequently undergo appreciable diffusion processes, thus remaining substantially confined in the implantation region.

Figure 7B:
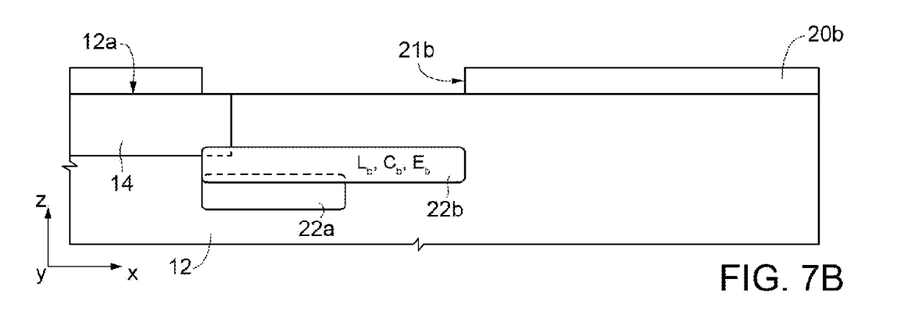

As shown in FIG. 7b, the manufacturing process then envisages removing the first mask 20a and subsequently providing a second mask 20b, on the top surface 12a of the structural layer 12 (alternatively, the second mask 20b may be defined starting from the first mask 20a by selective removal of material).

The second mask 20b has a respective opening 21b, having a width Lb, such as to include the opening in the first mask 21a, that substantially corresponds to the sum of the widths Wa and Wb of the first and second ring portions 15a, 15b of the ring region 15. The opening 21b thus again exposes the end portion of the functional region 14 and further a portion of the underlying structural layer 12.

As is shown once again in FIG. 7b, made in a self-aligned way through the second mask 20b is a respective ion implantation of dopants, in the example of a P type, followed by thermal activation, to obtain a second doped region 22b, which is located at a second depth within the structural layer 12, in particular corresponding to the depth Jb of the second ring portion 15b of the ring region 15.

The second doped region 22b partially overlaps the first doped region 22a in the vertical direction z (in addition to overlapping entirely the first doped region 22a itself in the horizontal direction x).

The second implantation is carried out with a second energy Eb, such as to locate the second doped region 22b at the desired depth and with, and a second dopant dose or concentration Cb, for example higher than the first concentration Ca.

Figure 7C:
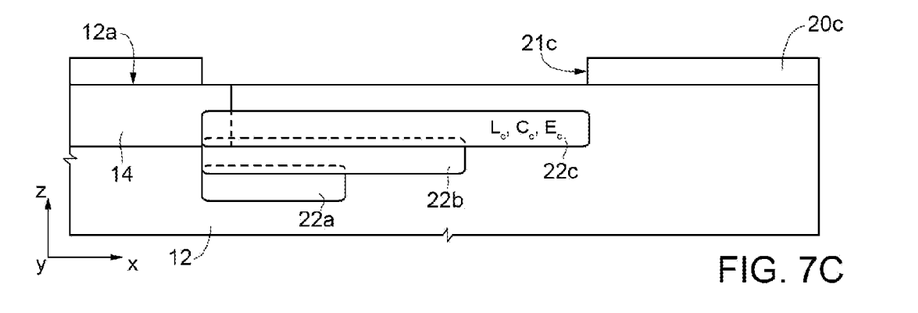

In a substantially similar way, the manufacturing process then proceeds, as shown in FIG. 7c, with formation of a third mask 20c, over the top surface 12a of the structural layer 12 (once again, the third mask 20c may be defined starting from the second mask 20b by selective removal of material).

The third mask 20c has a respective opening 21c, having a width Lc such as to include the opening in the second mask 21b, substantially corresponding to the sum of the widths Wa, Wb and Wc of the first, second and third ring portions 15a, 15b, 15c, once again starting from the same end portion of the functional region 14.

Made through the third mask 20c is a respective self-aligned ion implantation of dopants, in the example of a P type, followed by thermal activation, to provide a third doped region 22c, which is located at a third depth within the structural layer 12, in particular corresponding to the depth Jc of the third ring portion 15c of the ring region 15.

The third doped region 22c partially overlaps the second doped region 22b in the vertical direction z (in addition to overlapping entirely the second doped region 22b in the horizontal direction x).

The third implantation is further carried out with a third energy Ec such as to locate the third doped region 22c at the desired depth, and with a third dopant dose or concentration Cc, for example higher than the second concentration Cb.

Figure 7D:
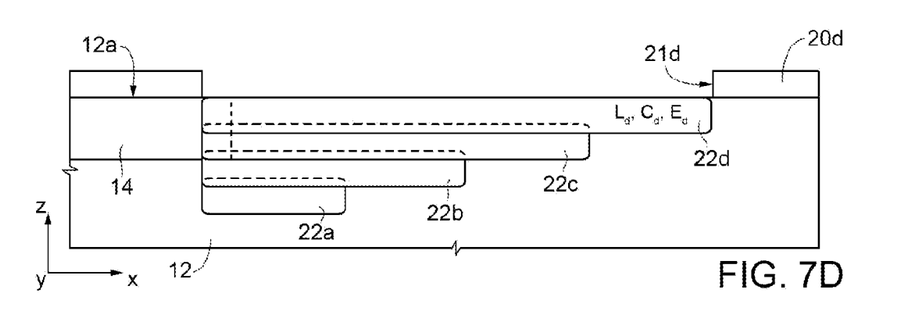

As shown in FIG. 7d, there is then provided a fourth mask 20d, on the top surface 12a of the structural layer 12.

The fourth mask 20d has a respective opening 21d, having a width Ld such as to include the opening in the third mask 21c, substantially corresponding to the sum of the widths Wa, Wb, Wc and Wd of the first, second, third and fourth ring portions 15a, 15b, 15c and 15d once again starting from the end portion of the functional region 14.

Made through the fourth mask 20d is a respective implantation of dopants (in the example, of a P type), followed by thermal activation, to provide a fourth doped region 22d, which is located at a fourth depth within the structural layer 12, in particular corresponding to the depth Jd of the fourth ring portion 15d of the ring region 15.

In the embodiment illustrated, the fourth doped region 22d is further located at the top surface 12a of the structural layer 12 (no further ring portions being envisaged; it is, however, evident that a greater or smaller number of ring portions may be envisaged, as desired).

The fourth doped region 22d partially overlaps the third doped region 22c in the vertical direction z (in addition to overlapping entirely the third doped region 22c in the horizontal direction x).

The fourth implantation is further carried out with a fourth energy Ed, such as to locate the fourth doped region 22d at the desired depth and with a fourth dopant dose or concentration Cd, for example higher than the third concentration Cc.

At the end of the manufacturing process, the fourth mask 20d is removed from the top surface 12a of the structural layer 12 (and the metal region 16 and the field-oxide region 17 are subsequently formed).

Within the structural layer 12, in contact with the functional region 14 at the edge region of the integrated device 11, the ring region 15 is thus formed, which comprises the ring portions 15a-15d, which are in mutual physical and electrical continuity (see once again FIG. 3) and has a laterally and vertically variable doping profile. In particular, each ring portion 15a-15d is formed by the vertical overlapping of respective portions of one or more of the doped regions 22a-22d, as will be evident from an examination of FIGS. 3 and 7d.

Figure 8:
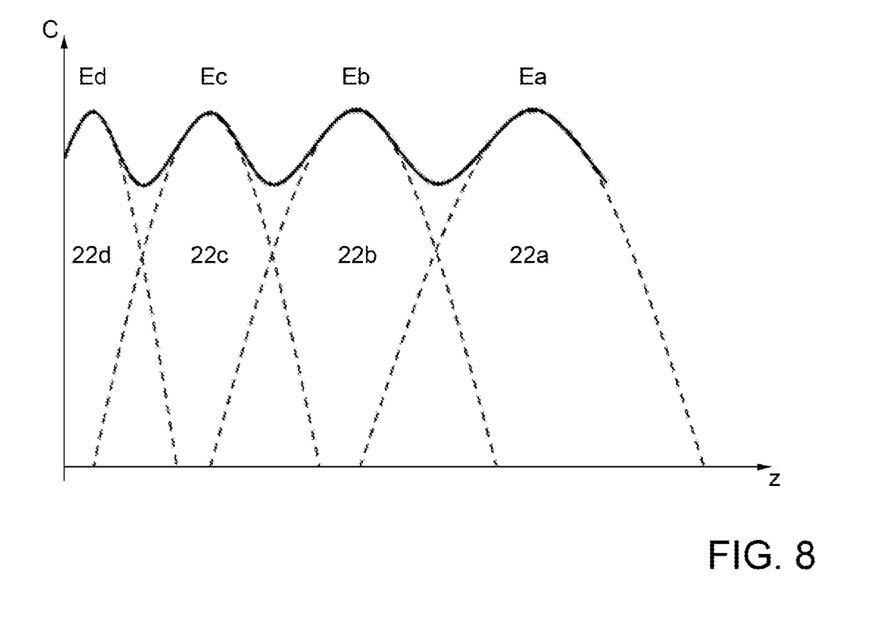
FIG. 8 shows a further plot representing the variable doping profile of the edge termination structure.
Figure 9A:
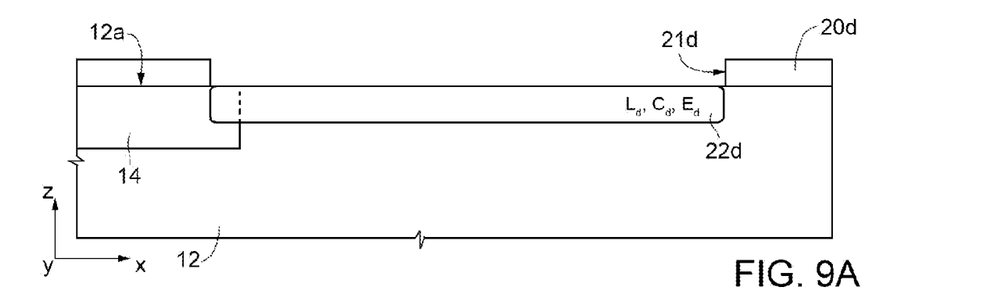
FIGS. 9a-9d are cross-sectional views in successive steps of the manufacturing process of the edge termination structure of FIG. 3, according to a further embodiment of the present solution.
Figure 9B:
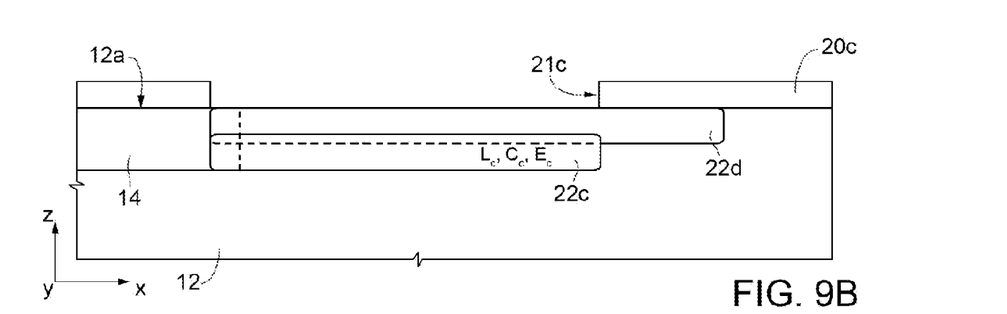
Figure 9C:
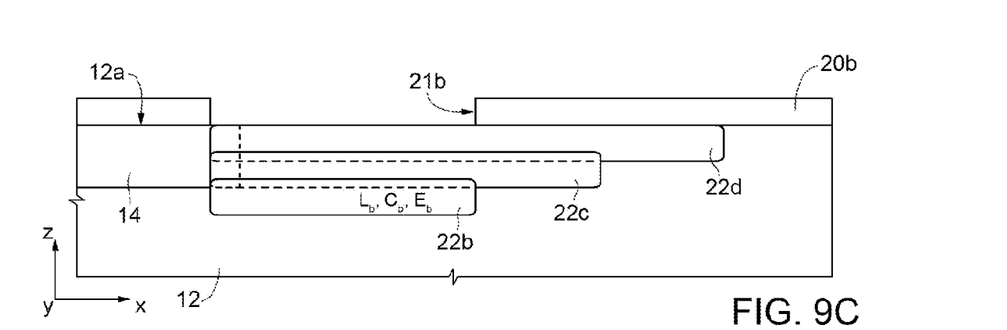
Figure 9D:
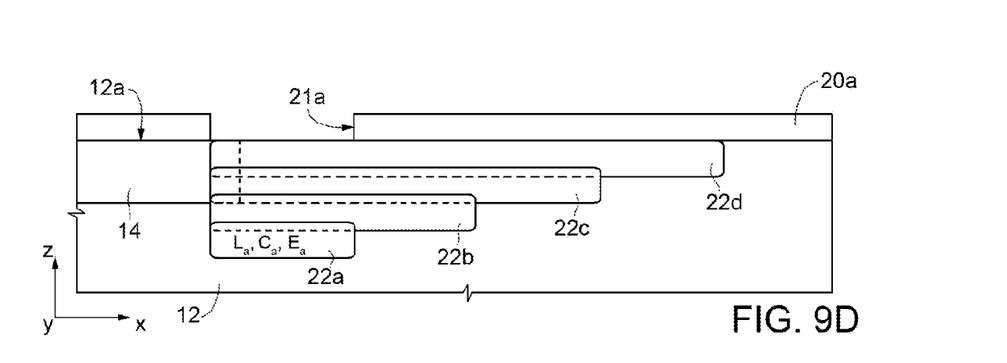

For instance, as shown in FIG. 8, the dopant concentration C has a resulting profile variable in the vertical direction z, with peaks at different levels of depth, each corresponding to one of the doped regions 22a-22d; said doping profile is usually defined as "box doping profile".

It should be noted that FIG. 8 regards the profile of the concentration C in the first ring portion 15a.

In the design stage, it is advantageously possible to act on one or more of the following parameters to define the desired profile of the electric field in the edge region of the integrated device 11:

the number of ring portions;
the width of each ring portion;
the junction depth of each ring portion; and
the dopant concentration of each implantation that defines a respective doped region.

A variant of the manufacturing process may envisage, as illustrated in FIGS. 9a-9d, substantially the reversal of the process steps previously described in detail to obtain the doped regions 22a-22d, starting, in this case, from the region closest to the surface (the fourth doped region 22d, in the example discussed previously) down to the buried region at the greatest depth in the structural layer 12 (the first doped region 22a in the example discussed previously).

The first embodiment described may, however, prove preferable, in so far as it prevents the need to carry out dopant implantations through already implanted regions, with the associated possible defectiveness problems.

The present Applicant has in any case verified, by experimental tests and simulations, that the solution described has higher electrical performance with respect to traditional solutions.

Figure 10A:
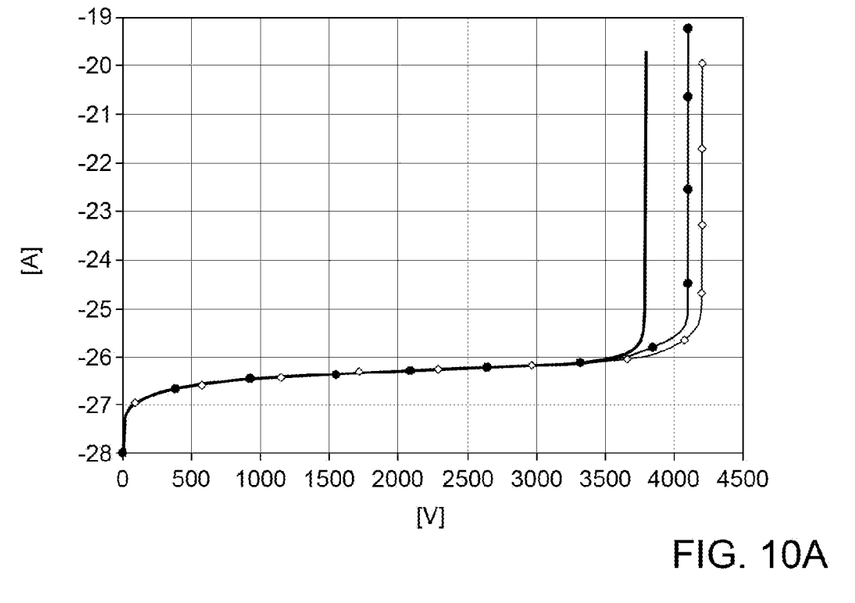
FIGS. 10a and 10b show comparative plots regarding the electrical performance of the edge termination structure of FIG. 3, as compared to solutions of a traditional type.
Figure 10B:
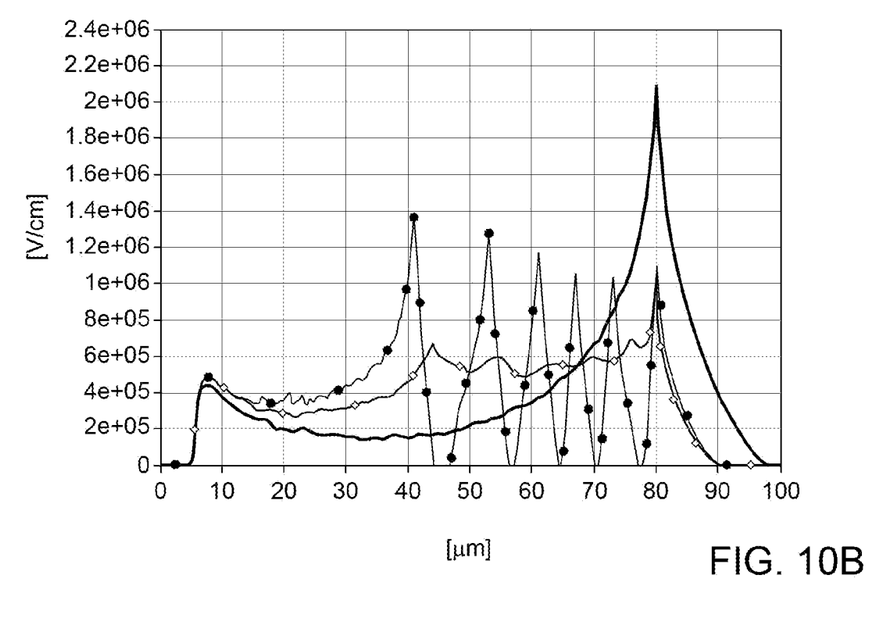

In particular, the plots of FIGS. 10a, 10b allow comparing the present solution with a traditional single-ring solution (of the type described with reference to FIG. 1) and with a traditional multiple-ring solution (of the type described with reference to FIG. 2), as regards respectively: the breakdown voltage (BV), represented in FIG. 10a in the current-voltage plot (regarding, in the example, a power diode); and the peak value of the electric field in the proximity of the top surface 12a of the structural layer 12, represented in FIG. 10b.

The above plots refer, by way of example, to a silicon-carbide (SiC) structure, with a voltage of 3300 V, a concentration of $3 \cdot 10^{15}$ and a thickness of 30 μm.

In the aforesaid plots, the single-ring solution is represented by a simple solid line, the multiple-ring solution by a line with full circles, whereas the present solution by a line with empty circles.

As may be noted, the present solution is substantially comparable to a traditional multiple-ring solution as regards the breakdown voltage, presenting, however, at the same time, a peak value of the electric field that is approximately halved, thus guaranteeing a lower overall stress of the integrated device 11 and an improvement both in terms of reliability and in terms of average service life.

From what has been described so far, the advantages that the present solution affords emerge clearly.

In any case, it is again emphasized that this solution is particularly flexible, since it adds further degrees of freedom in the design of the edge termination structure of a power integrated device and in the definition of an optimized electric-field distribution.

This solution is simple to implement and envisages the use of the same number of implantations as a traditional structure; the solution described further enables reduction of the influence of the process variables on the performance of the integrated device.

The physical continuity of the ring region enables a better control of the electric field.

The electrical performance is improved as compared to traditional structures. Alternatively, given the same performance, it is possible to reduce the size of the edge termination structure and obtain a general reduction in the dimensions of the corresponding integrated device.

In general, the solution described exploits to the full peculiar characteristics of silicon carbide to obtain the edge termination structure, for example the fact that the dopant implants remain localized within the structural layer 12 (not undergoing the phenomenon of diffusion).

Finally, it is clear that modifications and variations may be made to what has been described and illustrated herein, without thereby departing from the scope of the present disclosure.

In particular, it is emphasized that the solution described, albeit particularly advantageous for power integrated devices made in a silicon-carbide substrate, may be used also in the case of integrated devices made in a substrate of silicon or of a different semiconductor material, or including both silicon and silicon carbide.

Furthermore, this solution may be used also for integrated devices for non-power applications.

It is further evident that the number of ring portions that define the ring region of the edge termination structure may vary with respect to what has been illustrated and described previously by way of example.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated device, comprising:
   a structural layer, including semiconductor material doped with a first conductivity type and having a top surface defining a plane;
   a functional region doped with a second conductivity type and arranged in an active area of said structural layer at said top surface, near an edge area that externally surrounds said active area; and
   an edge termination region doped with said second conductivity type, joined to said functional region, and arranged in said edge area, wherein said edge termination region has a doping profile and a junction depth that vary along a first direction parallel to said plane, wherein:
   said edge termination region further has a doping profile that varies in a second direction orthogonal to said plane; and
   said edge terminal region comprises first and second edge termination portions, the first edge terminal portion contacting said functional region and having a first junction depth in said structure layer and a first width in the first direction, the second edge terminal portion contacting and extending under the first edge terminal portion and having a second width in the first direction that is different from the first width.

2. The integrated device according to claim 1, wherein said edge area is arranged between said active area and an external side wall of said structural layer and wherein said first direction is transverse to said external side wall.

3. The integrated device according to claim 1, wherein each of said first and second edge termination portions has a variable profile of dopant concentration in said second direction, starting from a top surface of said edge termination portion down to the respective junction depth.

4. The integrated device according to claim 1, wherein said first and second edge termination portions have respective charge amounts that are different from each other; wherein the charge amount of said first edge termination portion is greater than the charge amounts of the remaining edge termination portions and the charge amount of the second edge termination portion.

5. The integrated device according to claim 1, wherein said structural layer includes silicon carbide.

6. The integrated device according to claim 1, wherein said integrated device is a power device.

7. A process for manufacturing an integrated device, comprising:

providing a structural layer, including semiconductor material doped with a first conductivity type and having a top surface defining a plane;

forming a functional region, doped with a second conductivity type, in an active area of said structural layer at said top surface, near an edge area that externally surrounds said active area; and forming an edge termination region, doped with said second conductivity type, joined to said functional region, and arranged in said edge area, wherein forming the edge termination region comprises providing said edge termination region with a doping profile and a junction depth that vary in a first direction parallel to said plane, wherein forming the edge termination region comprises:

providing the doping profile of said edge termination region that varies in a second direction orthogonal to said plane; and forming a plurality of edge termination portions having respective widths in the first direction that are different from each other and respective junction depths in the second direction that are different from each other, wherein a top one of the edge termination portions contacts said functional region, and remaining edge termination portions of the plurality extend directly under the top edge termination portion.

8. The process according to claim 7, wherein forming the plurality of edge termination portions comprises performing respective localized dopant implantations having respective implantation energies and respective dopant concentrations.

9. The method process according to claim 7, wherein the width of said top edge termination portion is greater than the widths of the remaining edge termination portions, and the widths of the remaining edge termination portions decrease as a distance from said top edge termination portion increases.

10. The process according to claim 7, wherein forming the plurality of edge termination portions comprises forming a first edge termination portion, which has a greater junction depth than the remaining edge termination portions, and subsequently forming the remaining edge termination portions starting from a second edge termination portion vertically overlapping the first edge termination portion up to said top edge termination portion.

11. The process according to claim 7, wherein forming the plurality of edge termination portions comprises forming first said top edge termination portion and subsequently forming the remaining edge termination portions, starting from a first edge termination portion arranged vertically underneath the top edge termination portion down to a deep second edge termination portion having the greatest junction depth.

12. The process according to claim 7, wherein forming the plurality of edge termination portions comprises performing a corresponding plurality of dopant implantations through respective implantation masks; each of said implantations being followed by a respective step of thermal activation of the implanted dopants.

13. An integrated device, comprising:
a structural layer, including semiconductor material doped with a first conductivity type and having a top surface defining a plane;

a functional region doped with a second conductivity type and arranged in an active area of said structural layer at said top surface, near an edge area that externally surrounds said active area; and an edge termination region doped with said second conductivity type, joined to said functional region, and arranged in said edge area, wherein said edge termination region has a doping profile and a junction depth that vary along a first direction parallel to said plane, wherein said edge termination region comprises a plurality of edge termination portions, arranged adjacent to one another in mutual contact, a first of said edge termination portions being connected to said functional region; said edge termination portions having respective junction depths in said structural layer that are distinct from each other, wherein said edge termination portions have respective widths in said first direction that are different from each other and said edge termination portions are positioned directly under each other.

14. The integrated device according to claim 13, wherein each of said edge termination portions has a variable profile of dopant concentration in a second direction, which is orthogonal from the plane.

15. An integrated device, comprising:
a structural layer, including semiconductor material doped with a first conductivity type and having a top surface defining a plane;

a functional region doped with a second conductivity type and arranged in an active area of said structural layer at said top surface, near an edge area that externally surrounds said active area; and an edge termination region doped with said second conductivity type, joined to said functional region, and arranged in said edge area, wherein said edge termination region has a doping profile and a junction depth that vary along a first direction parallel to said plane, wherein the edge termination region comprises forming a plurality of doped regions having said second conductivity type, the doped regions having respective junction depths in said structural layer; at least one of said doped regions extending from, and in contact with, said functional region, the doped regions having, different widths in said first direction and partially overlapping one another in a second direction, orthogonal to the plane.

16. The integrated device according to claim 15, wherein said edge area is arranged between said active area and an external side wall of said structural layer and wherein said first direction is transverse to said external side wall.

* * * * *